US007227414B2

(12) United States Patent
Drottar

(10) Patent No.: US 7,227,414 B2
(45) Date of Patent: Jun. 5, 2007

(54) APPARATUS FOR RECEIVER EQUALIZATION

(75) Inventor: Ken Drottar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/607,799

(22) Filed: Jun. 27, 2003

(65) Prior Publication Data

US 2004/0263253 A1 Dec. 30, 2004

(51) Int. Cl.
H03F 3/16 (2006.01)
(52) U.S. Cl. .................................... 330/277; 330/253
(58) Field of Classification Search ............... 330/277, 330/280, 291, 293
See application file for complete search history.

(56) References Cited

U.S. PATENT DOCUMENTS

| 4,446,444 A | * | 5/1984 | Patterson, III | .............. 330/264 |
| 4,766,394 A | | 8/1988 | Yukawa | |
| 5,939,942 A | * | 8/1999 | Greason et al. | ............. 330/253 |
| 5,990,708 A | * | 11/1999 | Hu | ............................... 327/89 |
| 6,118,318 A | * | 9/2000 | Fifield et al. | ............... 327/206 |

FOREIGN PATENT DOCUMENTS

| JP | 55107309 | 8/1980 |
| JP | 61050408 | 3/1986 |

OTHER PUBLICATIONS

Bazes, Mel, "Two Novel Fully Complementary Self-Biased CMOS Differential Amplifiers," XP 000203311, IEEE Journal of Solid-State Circuits, No. 2, pp. 165-168, Feb. 26, 1991.
Chappell, Barbara A., et al., "Fast CMOS ECL Receivers with 100-mV Worst-Case Sensitivity," XP002050848, IEEE Log No. 8718033, pp. 59-67, 1988.
International Search Report and Written Opinion from PCT/US2004/018295, International Filing Date Jun. 9, 2004.

* cited by examiner

Primary Examiner—Khanh Van Nguyen
(74) Attorney, Agent, or Firm—Robert D. Anderson

(57) ABSTRACT

In some embodiments an apparatus includes an amplifier, a first inverter having an input coupled to an output of the amplifier, and a second inverter having an input coupled to an output of the first inverter and an output, where the output of the second inverter is fed back to an input of the amplifier. Other embodiments are described and claimed.

42 Claims, 10 Drawing Sheets

APPARATUS FOR RECEIVER EQUALIZATION

TECHNICAL FIELD

The inventions generally relate to receiver equalization.

BACKGROUND

Conventional wide band amplifiers such as CMOS (Complementary Metal Oxide Semiconductor) amplifiers have a difference in gain between low and high frequencies. This causes a condition referred to as inter-symbol interference (ISI), which causes a frequency dependent loss. Traditional receiver equalization schemes using analog or DSP (Digital Signal Processing) techniques are very complex, use a large number of transistors, and consume a large amount of power.

BRIEF DESCRIPTION OF THE DRAWINGS

The inventions will be understood more fully from the detailed description given below and from the accompanying drawings of some embodiments of the inventions which, however, should not be taken to limit the inventions to the specific embodiments described, but are for explanation and understanding only.

DETAILED DESCRIPTION

Figure 1:
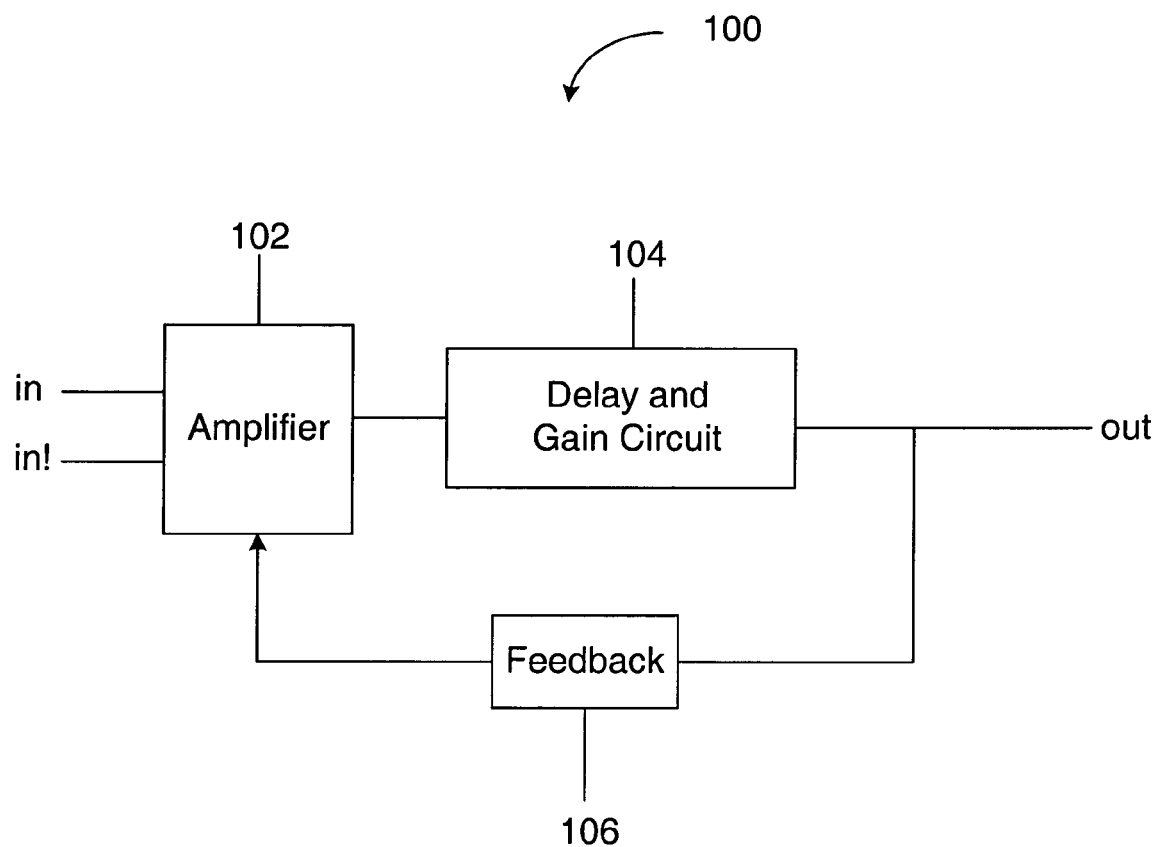
FIG. 1 is a block diagram representation of some embodiments of the inventions.

Some embodiments of the inventions relate to receiver equalization. Some embodiments are implemented in any very high speed serial differential link receiver. Some embodiments relate to high speed serial differential frequency equalization.

Frequency dependent loss is inherent in CMOS (Complementary Metal Oxide Semiconductor) circuits and in transmission lines. In some embodiments a frequency dependent loss created by inter-symbol interference (ISI) is counteracted and compensated for. When a receiver must process a wide frequency spectrum of data the ISI may be removed using feedback according to some embodiments. In some embodiments delay and/or gain are used to help remove the ISI. In some embodiments an amplifier is used that can realize the full gain bandwidth product potential of the transistors that form the amplifier. In some embodiments this amplifier is an amplifier formed of CMOS (Complementary Metal Oxide Semiconductor) transistors. In some embodiments any self-biased amplifier or latch may be used. In some embodiments a circuit is used that makes improvements in high frequency performance for any given CMOS gate geometry to which it is applied. In some embodiments the a circuit is used that makes improvements and advancements in power efficiency and design simplicity while counteracting and compensating for the frequency dependent loss created by ISI.

In some embodiments two inverters (for example, CMOS inverters) are coupled in series to an output of an amplifier (for example, a self biased amplifier). The two inverters create a correct state to provide negative feedback to the amplifier. The circuit including the two inverters provides delay and gain to the feedback. In some embodiments the closed loop gain of the amplifier never exceeds the open loop gain of the amplifier. In some embodiments the delay and gain are used to select the frequency at which the maximum amplifier gain is achieved.

In some embodiments negative feedback is mixed at the self-bias control of the amplifier. In some embodiments a hybrid of a Bazes amplifier and a Chappell amplifier is used. In some embodiments any self-biasing amplifier or latch is used. In some embodiments the amplifier uses a form of positive feedback to assist the amplifier gain. In some embodiments when positive and negative feedback signals mix, their individual effects are negated.

In some embodiments the longer the amplifier remains in one state, the closer the positive and negative feedback signals approach the rails, the control voltage (for example, self-bias control voltage) approaches half supply, and the amplifier reduces to a minimum output level but does not change state. This arrangement is the opposite of one artifact of transmission line inter-symbol interference which tends to encourage signals of long duration.

In some embodiments the negative feedback travels through two additional inverters of propagation delay than the positive feedback. This means that for a period of time equivalent to the propagation delay the two feedbacks (negative and positive) are pulling in the same direction. The system momentarily provides the maximum amount of positive feedback to the differential dV/dT on the input signal. This improves both the amplitude and width of the transition. This is the opposite of the other artifact associated with inter-symbol interference which tends to resist signals of short duration and leads to inaccurate output values in those cases.

In some embodiments an amplifier is sized for best open loop bandwidth. In some embodiments a first inverter is one-fourth the size of the amplifier output to maintain loading as low as possible. In some embodiments the first inverter is one-fourth the size of the second inverter in order to deliberately slow state propagation time through the negative feedback loop and minimize the possibility of the first inverter creating another pole in the system.

In some embodiments the amplifier works on a differential dV/dT, energy in the transition, rather than an actual eye opening (or "I opening") or crossing. This allows the amplifier to extract correct information form a closed eye (or "closed I").

In some embodiments positive feedback is applied to cross-coupled loads (e.g., using a p-channel amplifier, an n-channel amplifier and/or a CMOS amplifier). In some embodiments positive feedback is applied to improve performance, and delay and gain is added. In some embodiments negative feedback is applied.

In some embodiments an apparatus includes an amplifier, a first inverter having an input coupled to an output of the amplifier, and a second inverter having an input coupled to an output of the first inverter and an output, where the output of the second inverter is fed back to an input of the amplifier.

In some embodiments an apparatus includes an amplifier and a delay and gain circuit coupled to an output of the amplifier, where an output of the delay and gain circuit is fed back to the amplifier.

In some embodiments an amplifier includes an input, an inverse input, an output, a first p-channel MOSFET (Metal Oxide Semiconductor Field Effect Transistor) (pMOS transistor), a second pMOS transistor, a third pMOS transistor, a first n-channel MOSFET (nMOS transistor), a second nMOS transistor and a third nMOS transistor. The first pMOS transistor has a gate coupled to the input of the amplifier. The third pMOS transistor has a gate coupled to the inverse input of the amplifier and a source coupled to a source of the first pMOS transistor and to a drain of the second pMOS transistor. The first nMOS transistor has a gate coupled to the input of the amplifier. The second nMOS transistor has a gate coupled to a drain of the first pMOS transistor, a drain of the first nMOS transistor, and to a gate of the second pMOS transistor. The third nMOS transistor has a gate coupled to the inverse input of the amplifier, a drain coupled to a drain of the third pMOS transistor and a source coupled to a source of the first nMOS transistor and to a drain of the second nMOS transistor. The output of the amplifier is coupled to the drain of the third pMOS transistor and to the drain of the third nMOS transistor.

In some embodiments a system includes a transmitter, a receiver, and a transmission line (or interconnect) coupled to the transmitter and the receiver. The receiver includes an amplifier and a delay and gain circuit coupled to an output of the amplifier, where an output of the delay and gain circuit is fed back to the amplifier.

In some embodiments a method includes providing delay and gain to an output of an amplifier, and feeding back an output from the delay and gain to the amplifier.

In some embodiments a method includes amplifying an input signal, and compensating for a frequency dependent loss by feeding back an output signal to the amplifying.

In some embodiments positive feedback and delayed negative feedback are applied to an amplifier. In some embodiments gain is applied to delayed negative feedback that is applied to an amplifier. In some embodiments positive feedback and negative feedback are mixed. In some embodiments a ratio of positive feedback to negative feedback is balanced through gain on the negative feedback. In some embodiments positive feedback and negative feedback are supplied in a proportion that compensates for and/or counteracts a frequency dependent loss created by inter-symbol interference (ISI). In some embodiments positive feedback is applied quickly and negative feedback is delayed (and/or applied slowly). In some embodiments positive feedback and negative feedback are mixed to provide a desired affect of compensating for inter-symbol interference (ISI). In some embodiments positive feedback is created by an amplifier and negative feedback is applied to the amplifier from a delay and gain circuit. In some embodiments a delay and gain circuit includes two inverters connected in series.

FIG. 1 illustrates an apparatus 100 according to some embodiments. Apparatus 100 includes an amplifier 102, a delay and gain circuit 104, and a feedback loop 106. Amplifier 102 may also be referred to in some embodiments as "the first stage". Amplifier 102 may be a CMOS amplifier in some embodiments. Amplifier 102 includes two inputs, "in" and "!in", where "!in" is the inverse signal from "in". Delay and gain circuit 104 has an input coupled to an output of amplifier 102. Delay and gain circuit 104 has an output provided as an output signal. The output of delay and gain circuit 104 is also fed into feedback loop 106 to be provided as a control input to amplifier 102. In some embodiments feedback loop 106 may include known feedback circuitry. In some embodiments feedback loop 106 provides the output of delay and gain circuit 104 directly to the control input of amplifier 102.

Figure 2:
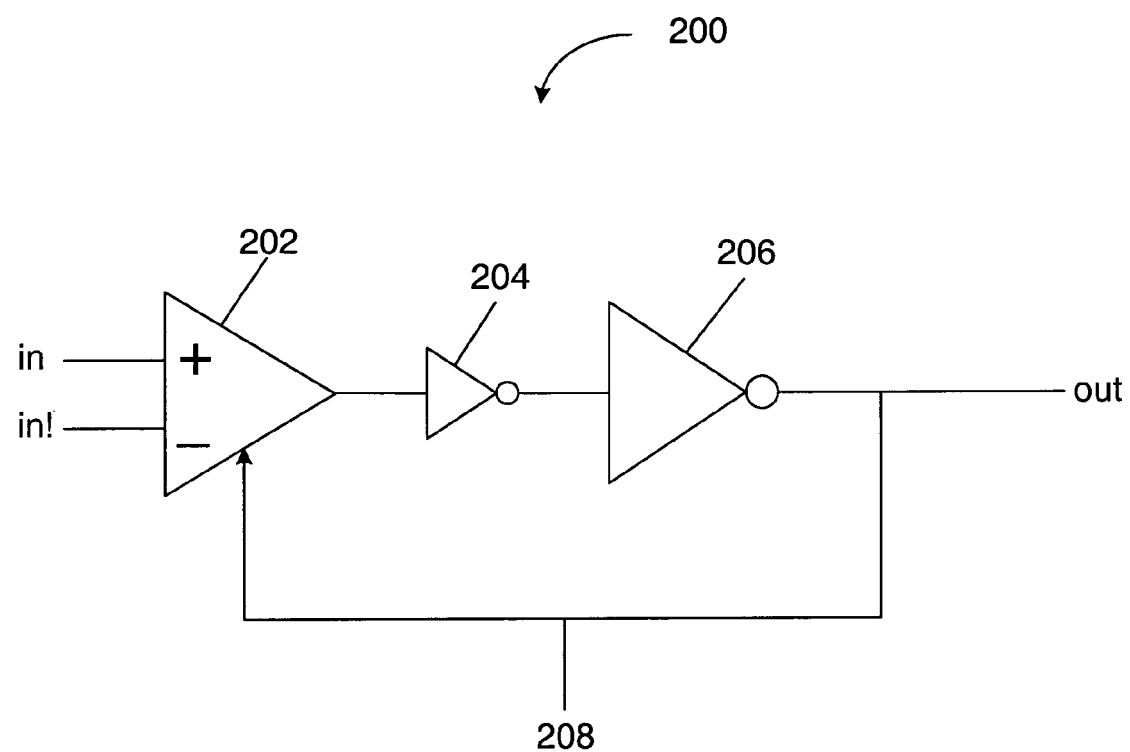
FIG. 2 is a block diagram representation of some embodiments of the inventions.

FIG. 2 illustrates an apparatus 200 according to some embodiments. Apparatus 200 includes an amplifier 202, a first inverter 204, a second inverter 206, and a feedback loop 208. Amplifier 202 may also be referred to in some embodiments as "the first stage". Amplifier 202 may be a CMOS amplifier in some embodiments. Amplifier 202 includes an input signal "in" and an inverse input signal "!in". First inverter 204 has an input coupled to an output of amplifier 202. Second inverter 206 has an input coupled to an output of first inverter 204. An output of second inverter 206 is provided as an output signal, and is also fed into a feedback loop 208 as a control input to amplifier 202.

In some embodiments sizes of first inverter 204 and second inverter 206 are used so that appropriate delay and gain are provided to the circuit. In some embodiments values of the inverters are chosen such that negative feedback is delayed as long as the smallest data change (that is, duty cycle distortion) where some data has a small duration. In some embodiments the values of the inverters are chosen so that negative feedback is delayed for a period corresponding to the period of the smallest data bit frequency.

Figure 3:
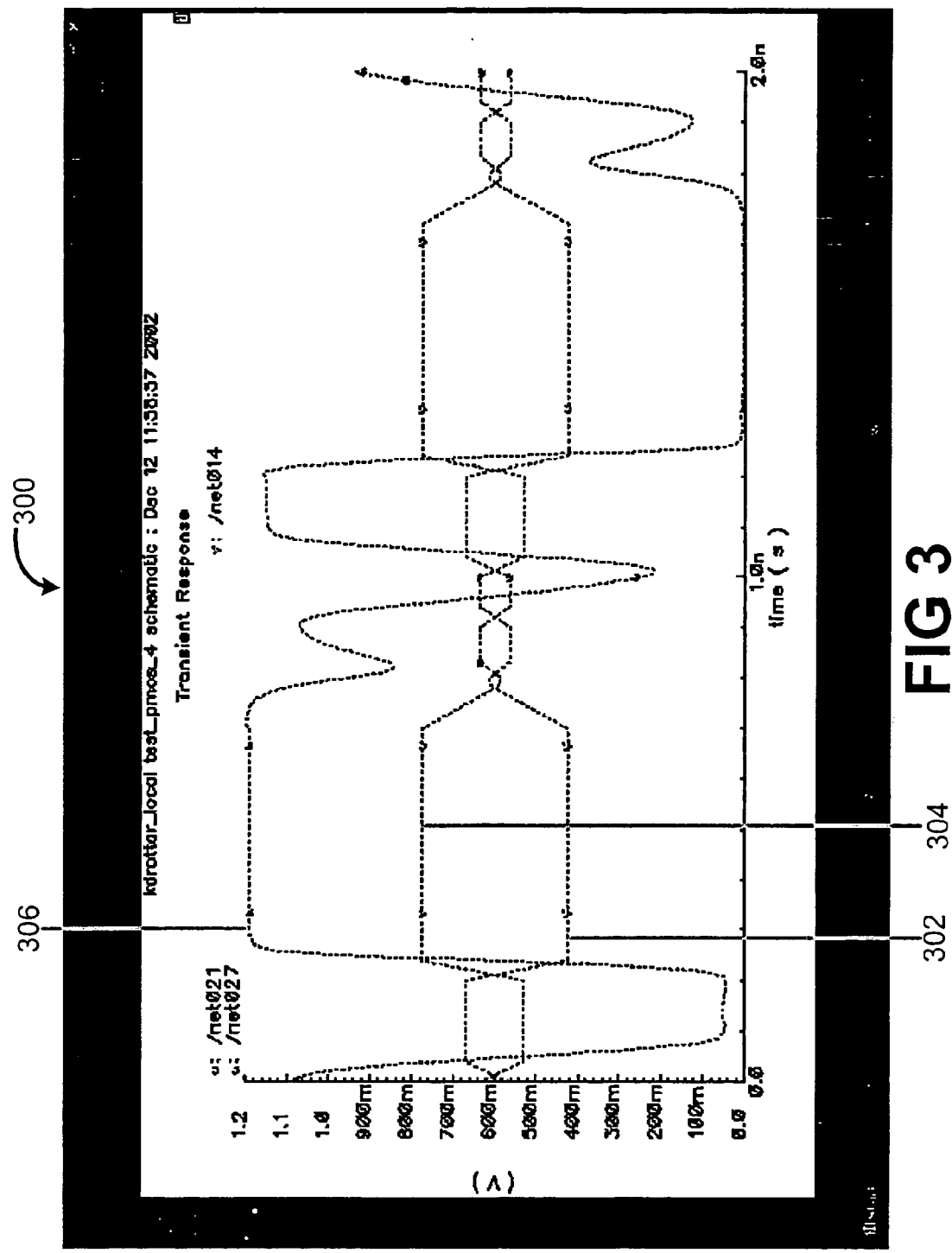
FIG. 3 is a waveform diagram illustrating a problem that may be overcome according to some embodiments of the inventions.

FIG. 3 illustrates signal waveforms 300 illustrating a problem that may be overcome according to some embodiments. The waveforms 300 illustrated in FIG. 3 include an input signal waveform 302, an inverse input signal waveform 304, and an output signal waveform 306. The illustrated input signal waveform 302, inverse input signal waveform 304 and output signal waveform 306 occur, for example, with an amplifier arrangement that does not solve an inter-symbol interference problem solved by some embodiments. Input signal 302 exhibits a pattern with the following logic values: "11000001010011111010". Inverse input signal 304 exhibits a pattern with the following logic values: "00111110101100000101". Output signal 306 initially drops to a low signal value (logic "0") in response to the first two input signal 302 logic values "11" and in response to the first two inverse input signal 304 logic values "00". Output signal 306 then rises to a high signal value (logic "1") in response to the next five input signal 302 logic values "00000" and in response to the next five inverse input signal 304 logic values "11111". Then when the input signal 302 rises to logic value "1" and the inverse input signal 304 drops to logic value "0" the output signal 306 begins to decrease. However, before output signal 306 is able to drop to a logic "0" value the input signal 302 drops to a logic value "0" and the inverse input signal 304 rises to a logic value "1". This causes the output signal 306 to increase before it ever reaches a logic value "0". This is a problem that can occur, for example, when the value of the input has been at one logic value for a long time and then transitions to the other value and back in a short amount of time. The output never recognizes the short transition value (in this case, output signal 306 never registers a logic value of "0" in response to the short transition of the input signal to a logic value of "1").

A similar problem occurs after the input signal 302 stays at a logic value of "1" for a while. For example, when input signal 302 exhibits a logic value of "11111" and inverse input signal 304 exhibits a logic value of "00000" and then input signal 302 switches to a logic value of "0" and inverse input signal 304 switches to a logic value of "1" for a short time period before switching back again a similar problem occurs as illustrated in FIG. 3. The output signal 306 stays at a logic value of "0" while the input signal 302 stays at a logic value of "1" for five time periods and while the inverse input signal 304 stays at a logic value of "0" for five time periods. However, when input signal 302 switches to a logic value of "0" and inverse input signal 304 switches to a logic value of "1" for one time period and then switches back again the output signal 306 does not rise to a logic value of "1" before decreasing in response to the switch of the input signal back to "1" and the switch of the inverse input signal back to "0".

Figure 4:
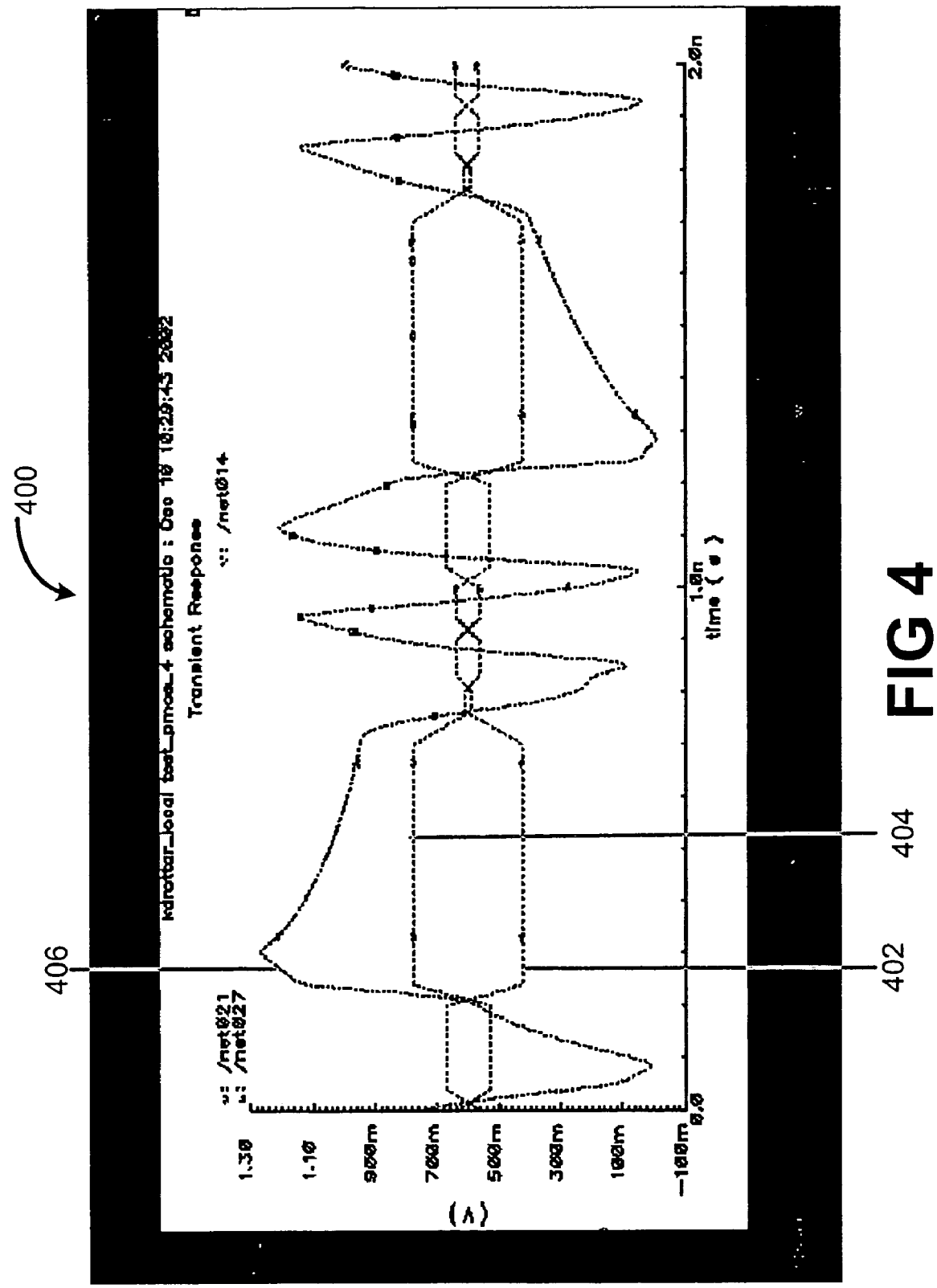
FIG. 4 is a waveform diagram illustrating some embodiments of the inventions.

FIG. 4 illustrates signal waveforms 400 according to some embodiments. The waveforms 400 illustrated in FIG. 4 include an input signal waveform 402, an inverse input signal waveform 404, and an output signal waveform 406. The illustrated input signal waveform 402, inverse input signal waveform 404 and output signal waveform 406 occur, for example, with an apparatus according to some embodiments.

Input signal 402 exhibits a pattern with the following logic values: "11000001010011111010". Inverse input signal 404 exhibits a pattern with the following logic values: "00111110101100000101". Similarly to output signal 306, output signal 406 initially drops to a low signal value (logic "0") in response to the first two input signal 402 logic values "11" and in response to the first two inverse input signal 404 logic values "00". However, output signal 406 does not remain at the lowest analog level as long as output signal 306 illustrated in FIG. 3. Output signal 406 begins to rise in value earlier than output signal 306, although it remains at a logic "0" value. Output signal 406 then rises to a high signal value (logic "1") in response to the next five input signal 402 logic values "00000" and in response to the next five inverse input signal 404 logic values "11111". Although output signal 406 stays at a high logic value during the five input signal 402 logic values "00000" and five inverse input signal 404 logic values "11111" it does decrease in level during those five signal time periods. Then when the input signal 402 rises to logic value "1" and the inverse input signal 404 drops to logic value "0" the output signal 406 is able to decrease down to a logic value "0" before the input signal changes again and drops to a logic value "0" and before the inverse input signal changes again and rises to a logic value "1". In this manner, unlike the output signal 306 in FIG. 3 and according to some embodiments the output signal 406 is able to recognize the transition that occurs after the value of the input has been at one logic value for a long time and then changes to the other value and back in a short amount of time.

Similarly, when input signal 402 exhibits a logic value of "11111" and inverse input signal 404 exhibits a logic value of "00000" and then input signal 402 switches to a logic value of "0" and inverse input signal 404 switches to a logic value of "1" for a short period of time before switching back again the problem associated with output signal 306 of FIG. 3 can also be avoided. The output signal 406 stays at a logic value of "0" while the input signal 402 stays at a logic value of "1" for five time periods and while the inverse input signal stays at a logic value of "0" for five time periods. However, unlike output signal 306 in FIG. 3, output signal 406 does not stay at the same low voltage level. The voltage level of output signal 406 begins to rise in voltage during the five time periods, but stays at a low ("0") logic value. When input signal 402 then switches to a logic value of "1" for one time period and then switches back again the output signal 406 is able to rise to a logic value of "1" before decreasing in response to the switch of the input signal back to "1" and the switch of the inverse input signal back to "0".

Figure 5:
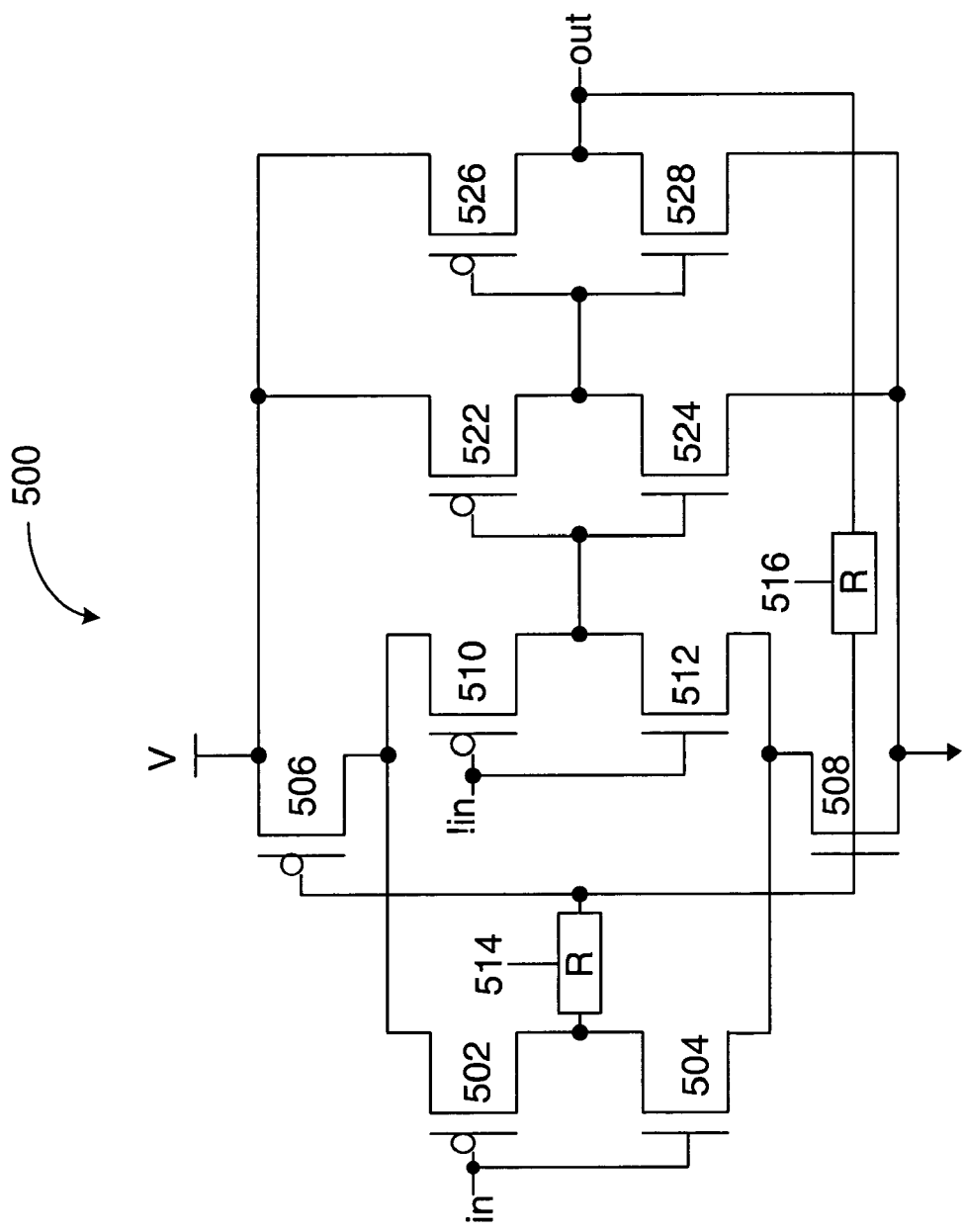
FIG. 5 is a circuit diagram representation of some embodiments of the inventions.

FIG. 5 illustrates an apparatus 500 according to some embodiments. In some embodiments apparatus 500 includes a p-channel MOSFET (Metal Oxide Semiconductor Field Effect Transistor) (pMOS transistor) 502, an n-channel MOSFET (nMOS transistor) 504, pMOS transistor 506, nMOS transistor 508, pMOS transistor 510, nMOS transistor 512, resistor 514, resistor 516, pMOS transistor 522, nMOS transistor 524, pMOS transistor 526 and nMOS transistor 528.

Transistors 502, 504, 506, 508, 510 and 512 (and in some embodiments also resistor 514) may form an amplifier according to some embodiments, which may be in some embodiments a wide band CMOS amplifier. Transistors 522 and 524 may form a first inverter. Transistors 526 and 528 may form a second inverter. An output of the second inverter is an output of the apparatus 500. The output of the amplifier (also referred to as the first stage amplifier) has analog precharge artifacts. In some embodiments the analog precharge artifacts are similar to the sagging affect illustrated in and described in reference to FIG. 3. The first and second inverters (sometimes referred to as the second stage) restores digital level signaling so that no sagging affect is present at the output of apparatus 500.

Figure 9:
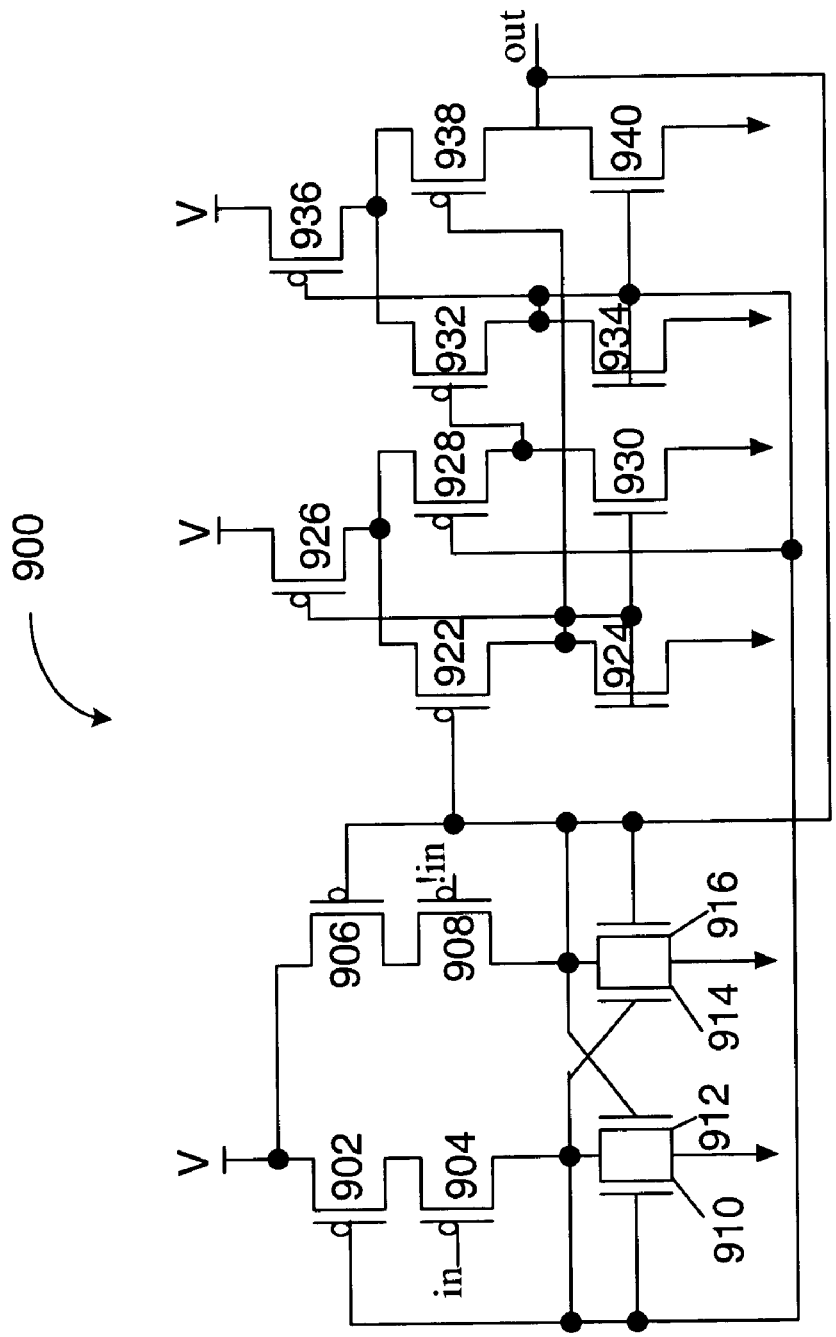
FIG. 9 is a circuit diagram representation of some embodiments of the inventions.
Figure 10:
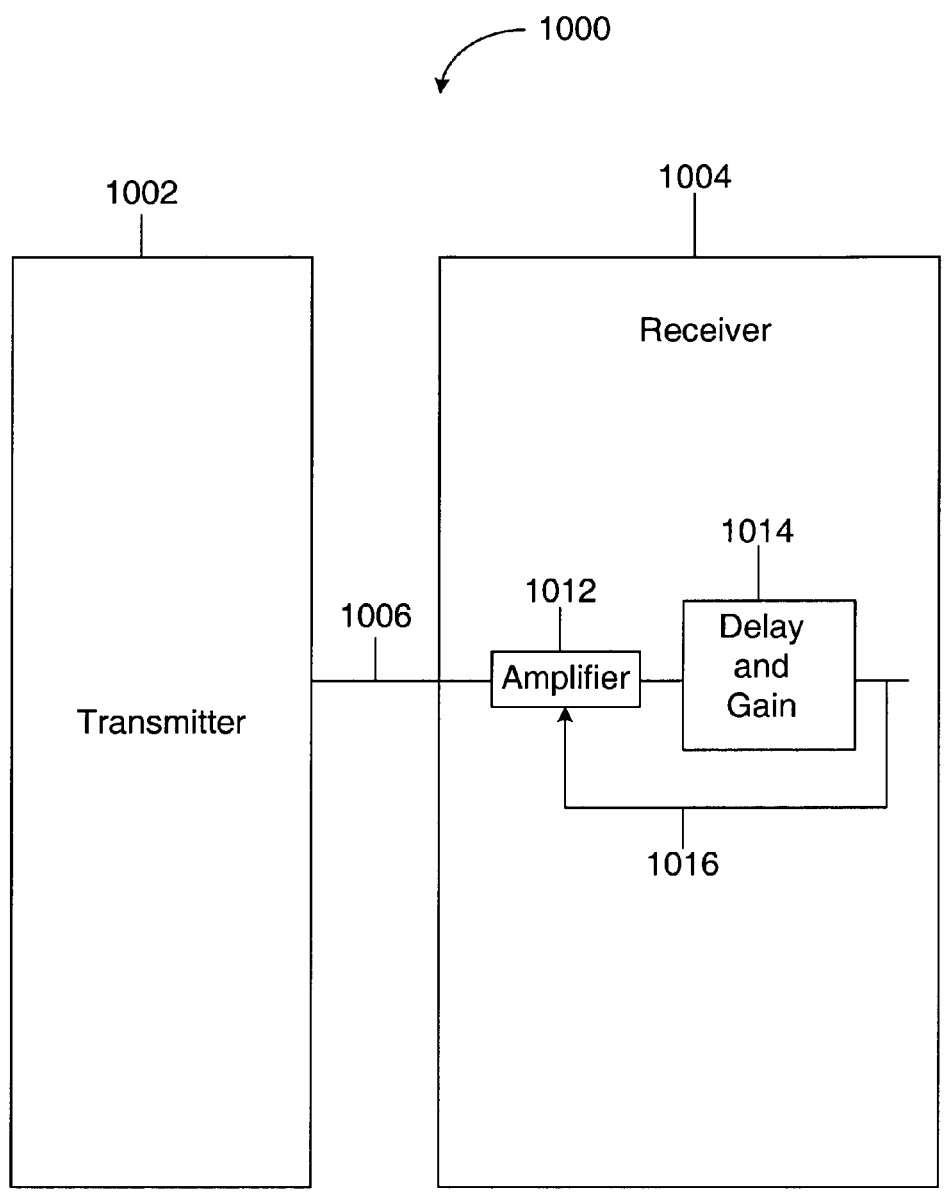
FIG. 10 is a block diagram representation of some embodiments of the inventions.

In some embodiments the amplifier in FIG. 5 may be used in other embodiments such as the amplifier 102 in FIG. 1, the amplifier 202 in FIG. 2, the amplifier 1012 in FIG. 10, or other amplifiers. In some embodiments the first inverter in FIG. 5 may be used in other embodiments such as the inverter 204 in FIG. 2, or may be included in other circuitry such as delay and gain circuit 104 of FIG. 1 or delay and gain circuit 914 of FIG. 9, or any other delay and gain circuit. In some embodiments the second inverter in FIG. 5 may be used in other embodiments such as the inverter 206 in FIG. 2, or may be included in other circuitry such as delay and gain circuit 104 of FIG. 1 or delay and gain circuit 1014 of FIG. 10, or any other delay and gain circuit. In some embodiments the first and second inverters in FIG. 5 may be combined to form circuits such as delay and gain circuit 104 of FIG. 1 or delay and gain circuit 914 of FIG. 9, for example.

A gate of pMOS transistor 502 is coupled to the input "in". A gate of nMOS transistor 504 is also coupled to input "in". A source of transistor 502 is coupled to a drain of pMOS transistor 506 and to a source of pMOS transistor 510. A drain of transistor 502 is coupled to a first terminal of resistor 514 and to a drain of nMOS transistor 504. A source of nMOS transistor 504 is coupled to a drain of nMOS transistor 508 and to a source of nMOS transistor 512. A gate of pMOS transistor 506 is coupled to a second terminal of resistor 514 and to a gate of nMOS transistor 508. A source of pMOS transistor 506 is coupled to a high voltage value V. A source of nMOS transistor 508 is coupled to a ground voltage (and/or a low voltage value), a source of nMOS transistor 524 and a source of nMOS transistor 528. A gate of pMOS transistor 510 and a gate of nMOS transistor 512 are coupled to an inverse input "!in". A drain of pMOS transistor 510 and a drain of nMOS transistor 512 are each coupled to a gate of pMOS transistor 522 and a gate of nMOS transistor 524. A source of pMOS transistor 522 is coupled to the high voltage value V. A source of nMOS transistor 524 is coupled to the ground and/or low voltage value. A drain of pMOS transistor 522 and a drain of nMOS transistor 524 are each coupled to a gate of pMOS transistor 526 and a gate of nMOS transistor 528. A source of pMOS transistor 526 is coupled to the high voltage value V. A source of nMOS transistor 528 is coupled to the ground and/or low voltage value. A drain of pMOS transistor 526 and a drain of nMOS transistor 528 are coupled together and provided as an output signal "out". This output signal "out" is also fed back through the resistor 516 to the gate of nMOS transistor 508.

In some embodiments a resistor array of two or more resistors such as resistor 514 and 516 are used to mix a positive feedback applied to the amplifier by the amplifier itself with a negative feedback applied to the amplifier from the output of the second inverter (at the output "out"). In some embodiments the resistors of the resistor array are connected in series with each other. In some embodiments resistors 514 and 516 passively mix the positive feedback and the negative feedback. In some embodiments resistors 514 and 516 are a passive mixing resistor array connected in series with each other, where resistor 514 is connected to positive feedback and resistor 516 is connected to negative feedback and a mixed signal is provided at a connection point between the two resistors. In some embodiments the positive feedback is applied to the amplifier quickly and the negative feedback is applied to the amplifier more slowly due to the delay created by the two inverters. The gain supplied by the two inverters may be used to provide a proportional amount of negative feedback proportional to the positive feedback such that a frequency dependent loss and/or an intersymbol interference (ISI) is counteracted and compensated for.

The circuit illustrated in FIG. 5 can be used to solve the problem illustrated in FIG. 3 in a manner similar to that illustrated in FIG. 4 so that, for example, a frequency dependent loss created by inter-symbol interference (ISI) is counteracted and compensated for.

While FIG. 5 illustrates some embodiments using CMOS (Complementary Metal Oxide Semiconductor) implementations it is understood that other embodiments may not use all MOS or CMOS technology, or any MOS or CMOS technology.

In some embodiments the CMOS transistors of FIG. 5 may have a length of 80 nm or of approximately 80 nm. In some embodiments widths of p-channel transistors 502, 506, 510 and 526 are 9.2 um or are approximately 9.2 um. In some embodiments a width of p-channel transistor 522 is 2.3 um or is approximately 2.3 um. In some embodiments widths of n-channel transistors 504, 508, 512 and 528 are 4 um or are approximately 4 um. In some embodiments a width of n-channel transistor 524 is 1 um or is approximately 1 um. In some embodiments a resistance of resistors 514 and 516 is 5000 ohms or is approximately 5000 ohms. In some embodiments high voltage value for the provided high voltage at the sources of transistors 506, 522 and 526 are 1.2 volts or are approximately 1.2 volts. Although exemplary values for transistor lengths, transistor widths, resistances and provided voltages are provided above, other values for some or all of these elements may be used according to some embodiments.

The amplifier illustrated in FIG. 5 formed by transistors 502, 504, 506, 508, 510 and 512 (and in some embodiments also resistor 514) may be viewed as a hybrid of a Bazes amplifier and a Chappell amplifier. Some embodiments use this hybrid amplifier. Some embodiments use a Bazes amplifier. Some embodiments use a Chappell amplifier.

Figure 6:
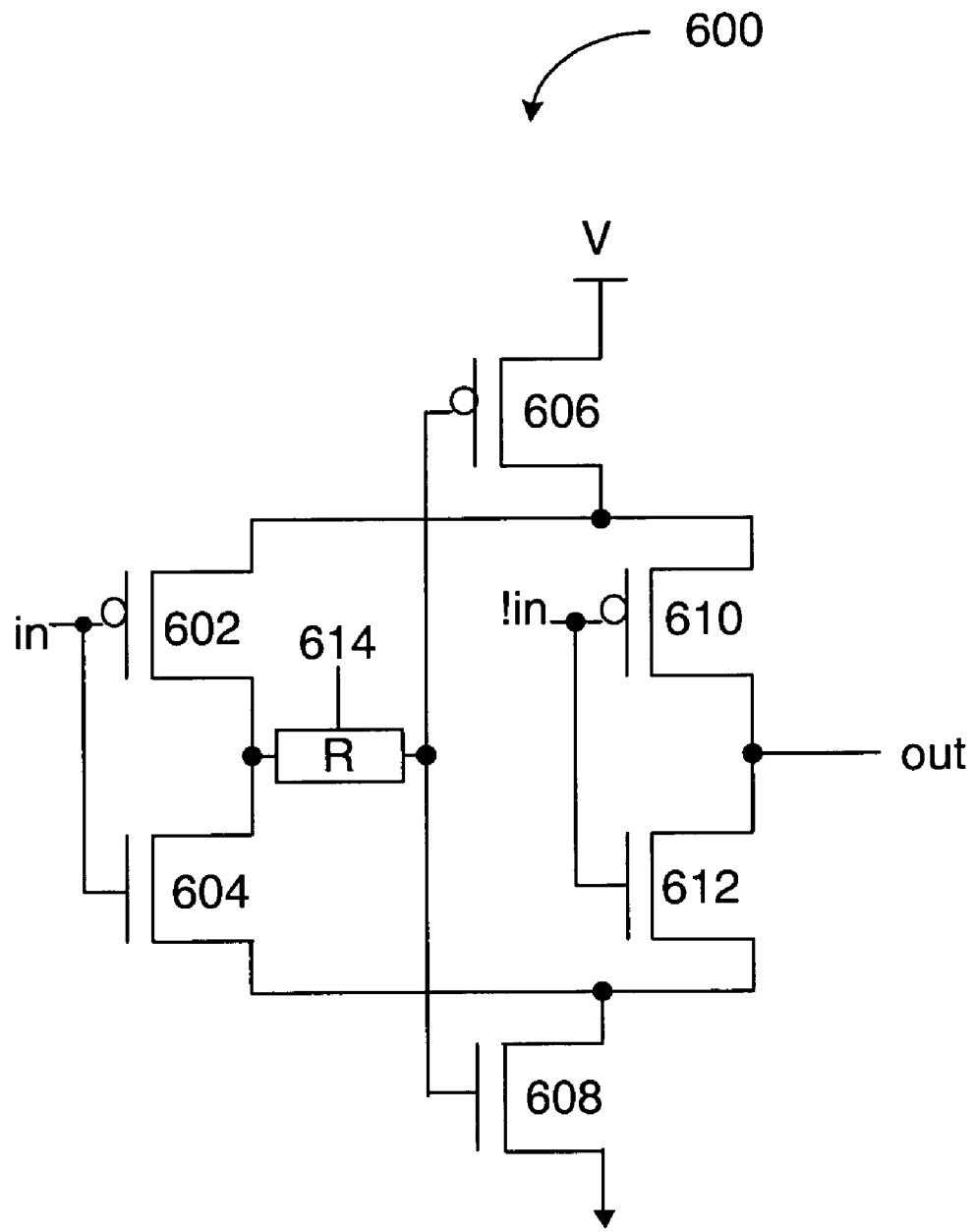
FIG. 6 is a circuit diagram representation of an amplifier according to some embodiments of the inventions.

FIG. 6 illustrates an amplifier 600 according to some embodiments. Amplifier 600 may be viewed as a hybrid of a Bazes amplifier and a Chappell amplifier. Amplifier 600 is similar to the amplifier illustrated in FIG. 5. Amplifier 600 includes an input ("in"), an inverse input ("!in"), an output ("out"), a pMOS transistor 602, an nMOS transistor 604, a pMOS transistor 606, an nMOS transistor 608, a pMOS transistor 610, an nMOS transistor 612 and a resistor 614. In some embodiments resistor 614 could have any resistance, including zero resistance (in such an embodiment there would be no resistor 614 and the lines coupled to the two terminals of resistor 614 would be directly coupled together). The amplifier 600 illustrated in FIG. 6 does not need to include resistor 614. However, resistor 614 has been included to show that the amplifier 600 may include a resistor 614 that is similar to resistor 514 illustrated in FIG. 5. In some embodiments resistor 614 may be included in a resistor array or in a group of resistors in series that are used to mix a positive feedback and a negative feedback similar to the resistors 514 and 516 in FIG. 5. In some embodiments resistor 614 is included in a resistor array or a group of resistors connected in series to passively mix a positive feedback and a negative feedback.

Each transistor 602, 604, 606, 608, 610 and 612 includes a source, a drain, and a gate. Resistor 614 includes a first terminal and a second terminal.

The source of pMOS transistor 602 is coupled to the drain of pMOS transistor 606 and to the source of pMOS transistor 610. The drain of pMOS transistor 602 is coupled to the first terminal of resistor 614 and to the drain of nMOS transistor 604. The gate of pMOS transistor 602 is coupled to the input "in" and to the gate of nMOS transistor 604.

The source of nMOS transistor 604 is coupled to the drain of nMOS transistor 608 and to the source of nMOS transistor 612. The drain of nMOS transistor 604 is coupled to the first terminal of resistor 614 and to the drain of pMOS transistor 602. The gate of nMOS transistor 604 is coupled to the input "in" and to the gate of pMOS transistor 602.

The source of pMOS transistor 606 is coupled to a high voltage source "V". The drain of pMOS transistor 606 is coupled to the source of pMOS transistor 602 and to the source of pMOS transistor 610. The gate of pMOS transistor 606 is coupled to the second terminal of resistor 614 and to the gate of nMOS transistor 608.

The source of nMOS transistor 608 is coupled to a low voltage and/or grounded voltage. The drain of nMOS transistor 608 is coupled to the source of nMOS transistor 604 and to the source of nMOS transistor 612. The gate of nMOS transistor 608 is coupled to the second terminal of resistor 614 and to the gate of pMOS transistor 606.

The source of pMOS transistor 610 is coupled to the drain of pMOS transistor 606 and to the source of pMOS transistor 602. The drain of pMOS transistor 610 is coupled to the output "out" and to the drain of nMOS transistor 612. The gate of pMOS transistor 610 is coupled to the inverse input "!in" and to the gate of nMOS transistor 612.

The source of nMOS transistor 612 is coupled to the source of nMOS transistor 604 and to the drain of nMOS transistor 608. The drain of nMOS transistor 612 is coupled to the drain of pMOS transistor 610 and to the output "out". The gate of nMOS transistor 612 is coupled to the inverse input "!in" and to the gate of pMOS transistor 610.

The first terminal of resistor 614 is coupled to the drain of pMOS transistor 602 and to the drain of nMOS transistor 604. The second terminal of resistor 614 is coupled to the gate of pMOS transistor 606 and to the gate of nMOS transistor 608.

While FIG. 5 illustrates some embodiments using CMOS (Complementary Metal Oxide Semiconductor) implementations it is understood that other embodiments may not use all MOS or CMOS technology, or any MOS or CMOS technology.

In some embodiments the CMOS transistors of FIG. 6 may have a length of 80 nm or of approximately 80 nm. In some embodiments widths of p-channel transistors 602, 606 and 610 are 9.2 um or are approximately 9.2 um. In some embodiments widths of n-channel transistors 604, 608 and 612 and 528 are 4 um or are approximately 4 um. In some embodiments a resistance of resistors 614 is 5000 ohms or is approximately 5000 ohms. In some embodiments high voltage value for the provided high voltage at the source of transistor 606 is 1.2 volts or is approximately 1.2 volts. In some embodiments the provided low voltage at the source of transistor 608 is 0 volts or is approximately 0 volts. Although exemplary values for transistor lengths, transistor widths, resistances and provided voltages are provided above, other values for some or all of these elements may be used according to some embodiments.

Figure 7:
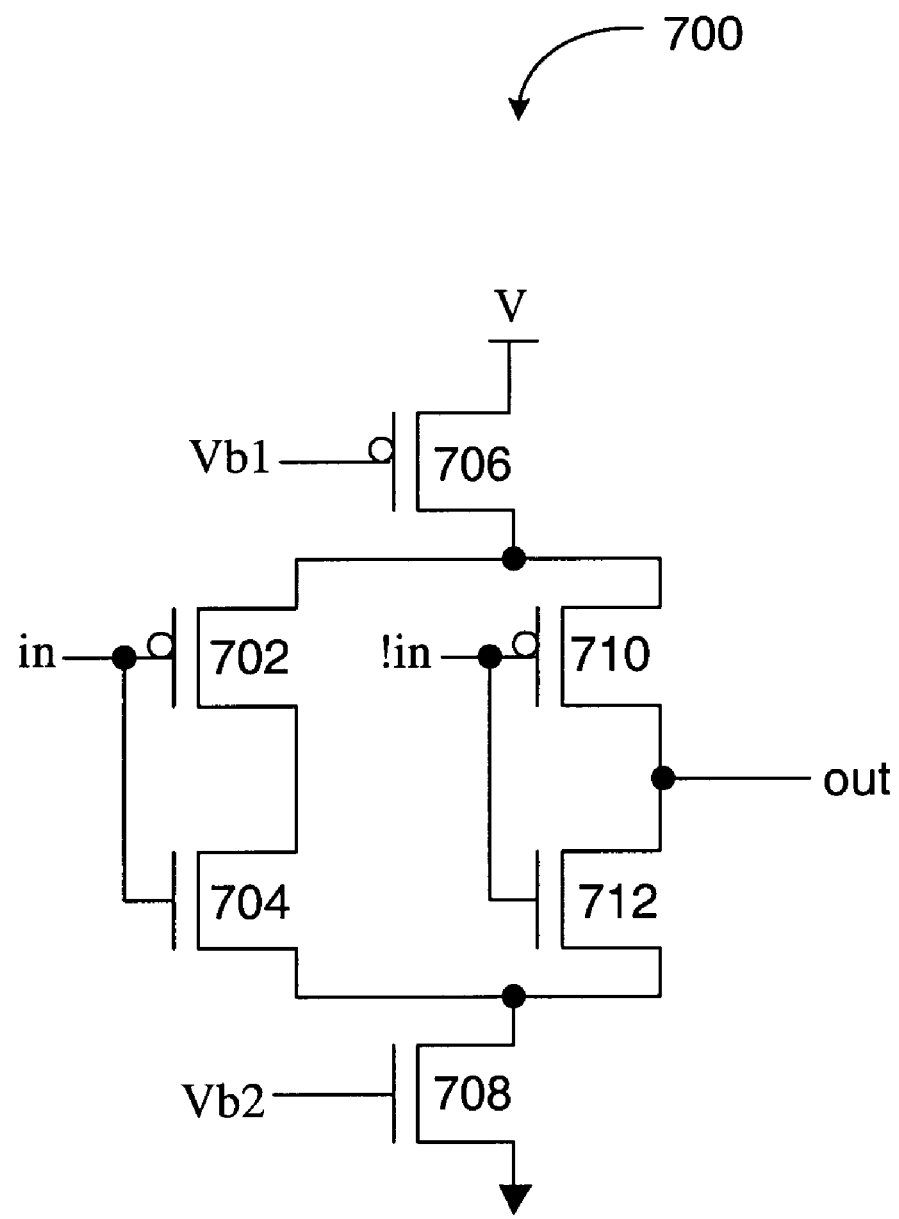
FIG. 7 is a circuit diagram representation of an amplifier according to some embodiments of the inventions.

FIG. 7 illustrates a Bazes amplifier 700 that may be used in implementing some embodiments. Amplifier 700 includes an input "in", an inverse input "!in", a bias voltage input Vb1, a bias voltage input Vb2, an output "out", a pMOS transistor 702, an nMOS transistor 704, a pMOS transistor 706, and nMOS transistor 708, a pMOS transistor 710 and an nMOS transistor 712. Voltages Vb1 and Vb2 are bias voltages provided at the gates of pMOS transistor 706 and nMOS transistor 708, respectively. The bias voltages Vb1 and Vb2 set the current for two current sources. A Bazes amplifier such as amplifier 700 may be used in implementing some embodiments.

Each of the transistors 702, 704, 706, 708, 710 and 712 includes a source, a drain and a gate. The source of pMOS transistor 702 is coupled to the drain of pMOS transistor 706 and to the source of pMOS transistor 710. The drain of pMOS transistor 702 is coupled to the drain of nMOS transistor 704. The gate of pMOS transistor 702 is coupled to the input "in" and to the gate of nMOS transistor 704. The source of nMOS transistor 704 is coupled to the drain of nMOS transistor 708 and to the source of nMOS transistor 712. The source of pMOS transistor 706 is coupled to a high voltage source "V". The gate of pMOS transistor 706 is coupled to the bias voltage Vb1. The source of nMOS transistor 708 is coupled to a low voltage source (and/or ground voltage). The gate of nMOS transistor 708 is coupled to the bias voltage Vb2. The drain of pMOS transistor 710 is coupled to the output "out" and to the drain of nMOS transistor 712. The gate of pMOS transistor 710 is coupled to the inverse input "!in" and to the gate of nMOS transistor 712.

Figure 8:
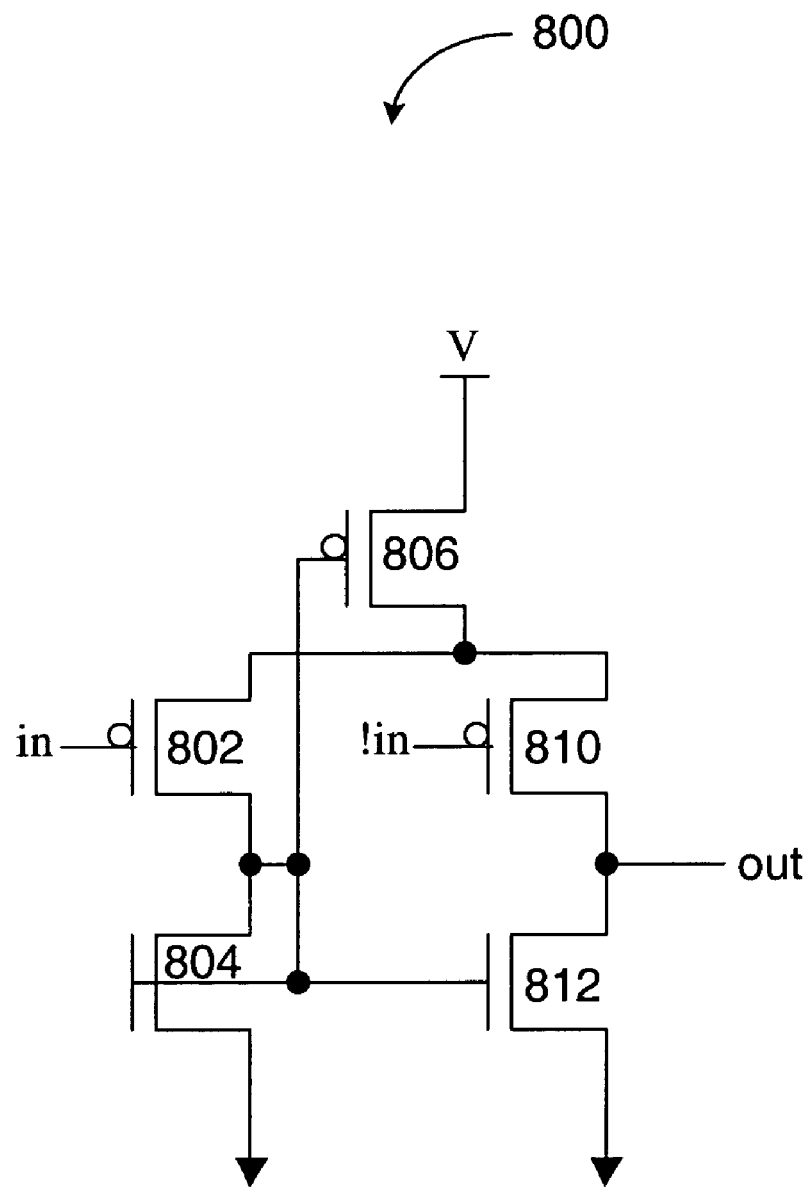
FIG. 8 is a circuit diagram representation of an amplifier according to some embodiments of the inventions.

FIG. 8 illustrates a Chappell amplifier 800 that may be used in implementing some embodiments. Amplifier 800 includes an input "in", an inverse input "!in", an output "out", a pMOS transistor 802, an nMOS transistor 804, a pMOS transistor 806, a pMOS transistor 810 and an nMOS transistor 812. A Chappell amplifier such as amplifier 800 may be used in implementing some embodiments.

Each of the transistors 802, 804, 806, 810 and 812 includes a source, a drain and a gate. The source of pMOS transistor 702 is coupled to the drain of pMOS transistor 806 and to the source of pMOS transistor 810. The drain of pMOS transistor 802 is coupled to the drain of nMOS transistor 804, the gate of nMOS transistor 804, the gate of nMOS transistor 812, and to the gate of pMOS transistor 806. The gate of pMOS transistor 802 is coupled to the input "in". The source of nMOS transistor 804 is coupled to a low voltage source (and/or ground voltage). The source of pMOS transistor 806 is coupled to a high voltage source "V". The drain of pMOS transistor 810 is coupled to the output "out" and to the drain of nMOS transistor 812. The gate of pMOS transistor 810 is coupled to the inverse input "!in". The source of nMOS transistor 812 is coupled to a low voltage source (and/or ground voltage) which may be the same voltage as coupled to the source of nMOS transistor 804.

FIG. 9 illustrates an apparatus 900 according to some embodiments. In some embodiments apparatus 900 is a p-channel implementation. Apparatus 900 includes an input "in", an inverse input "!in, an output "out", a pMOS transistor 902, a pMOS transistor 904, a pMOS transistor 906, a pMOS transistor 908, an nMOS transistor 910, an nMOS transistor 912, an nMOS transistor 914, an nMOS transistor 916, a pMOS transistor 822, an nMOS transistor 924, a pMOS transistor 926, a pMOS transistor 928, an nMOS transistor 930, a pMOS transistor 932, an nMOS transistor 934, a pMOS transistor 936, a pMOS transistor 938 and an nMOS transistor 940.

In some embodiments pMOS transistors 902, 904, 906, 908 and nMOS transistors 910, 912, 914 and 916 form an amplifier. In some embodiments pMOS transistors 922, 926 and 928 and nMOS transistors 924 and 930 form a first inverter. In some embodiments pMOS transistors 932, 936 and 938 and nMOS transistors 934 and 940 form a second inverter. The amplifiers, first inverter and second inverter mentioned above in reference to FIG. 9 may be implemented in various embodiments illustrated and/or described herein and in other embodiments.

FIG. 10 illustrates a system 1000 according to some embodiments. System 1000 includes a transmitter 1002, a receiver 1004 and a transmission line 1006 coupled between the transmitter 1002 and the receiver 1004. Receiver 1004 includes an amplifier 1012, a delay and gain circuit 1014 and feedback 1016 from an output of the delay and gain circuit to the amplifier 1012. In some embodiments the closed loop gain of the amplifier 1012 never exceeds its open loop gain. Varying the delay and gain of the delay and gain circuit 1014 selects the frequency at which maximum amplifier gain is achieved. In some embodiments the amplifier 1012 may be any type of amplifier including the amplifiers illustrated and described herein. In some embodiments the delay and gain circuit 1014 may be any type of delay and gain circuit including the delay and gain circuits (and/or two inverter circuits) illustrated and described herein. In some embodiments the gain/bandwidth of the apparatus including amplifier 1012 and delay and gain circuit 1014 is the same magnitude as the loss/bandwidth of the transmission line 1006.

Any of the amplifiers illustrated and described herein (for example, amplifier 102 in FIG. 1, amplifier 202 in FIG. 2, and/or amplifier 1012 in FIG. 10) could be a variety of different amplifiers in some embodiments, including but not limited to a Bazes amplifier similar to or the same as the Bazes amplifier illustrated in FIG. 7, a Chappell amplifier similar to or the same as the Chappell amplifier illustrated in FIG. 8, a hybrid amplifier such as the amplifier illustrated in FIG. 5 and/or in FIG. 6, an amplifier such as the amplifier in FIG. 9, or any other amplifier.

In some embodiments the techniques and circuits described herein are implemented within a high speed serial receiver or transceiver. Damage added by a transmission line may be repaired using some embodiments. Some embodiments may be implemented in receivers or in transceivers.

Some embodiments may be implemented in any circuit including an amplifier. Some embodiments may be implemented in any receiver, any transceiver and/or any clock tree that distributes clock pulses to various devices in a chip or a system.

In each system shown in a figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances "an embodiment," "one embodiment," or "some embodiments" are not necessarily all referring to the same embodiments.

If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

The inventions are not restricted to the particular details listed herein. Indeed, those skilled in the art having the benefit of this disclosure will appreciate that many other variations from the foregoing description and drawings may be made within the scope of the present inventions. Accordingly, it is the following claims including any amendments thereto that define the scope of the inventions.

What is claimed is:

1. An apparatus comprising:
an amplifier;
a first inverter having an input coupled to an output of the amplifier; and
a second inverter having an input coupled to an output of the first inverter and an output, wherein the output of the second inverter is fed back to an input of the amplifier;
wherein the amplifier provides positive feedback and the output of the second inverter is fed back to the amplifier as negative feedback; and
wherein the amplifier mixes the positive feedback and the negative feedback.

2. The apparatus as claimed in claim 1, wherein the amplifier is a CMOS amplifier.

3. The apparatus as claimed in claim 2, wherein the CMOS amplifier is a hybrid Bazes and Chappell amplifier.

4. The apparatus as claimed in claim 3, wherein:
the amplifier includes a first, a second and a third pMOS transistor and a first, a second and a third nMOS transistor;
a gate of the first pMOS transistor and a gate of the first nMOS transistor are coupled to an input;
a gate of the second pMOS transistor and a gate of the second nMOS transistor are coupled to a drain of the first pMOS transistor and a drain of the first nMOS transistor; and
a gate of the third pMOS transistor and a gate of the third nMOS transistor are coupled to an inverse input.

5. The apparatus as claimed in claim 4, wherein the gate of the second pMOS transistor and the gate of the second nMOS transistor are coupled to the drain of the first pMOS transistor and the drain of the first nMOS transistor via a resistor.

6. The apparatus as claimed in claim 1, wherein the second inverter is approximately four times the size of the first inverter.

7. The apparatus as claimed in claim 1, wherein the first inverter is approximately one-fourth the size of the output of the amplifier.

8. The apparatus as claimed in claim 1, wherein the first inverter is approximately one-fourth the size of the output of the amplifier and the first inverter is approximately one-fourth the size of the second inverter.

9. The apparatus as claimed in claim 4, wherein the amplifier further includes a resistor, wherein the resistor is included in a circuit that mixes positive feedback provided by the amplifier and negative feedback provided to the amplifier from the output of the second inverter.

10. The apparatus as claimed in claim 1, further comprising an output, wherein the output is coupled to the output of the second inverter.

11. The apparatus as claimed in claim 1, wherein the output does not include evidence of precharging from the amplifier.

12. An apparatus comprising:
an amplifier; and
a delay and gain circuit coupled to an output of the amplifier, wherein an output of the delay and gain circuit is fed back to the amplifier;
wherein the amplifier provides positive feedback and the output of the delay and gain circuit is fed back to the amplifier as negative feedback; and
wherein the amplifier includes a resistor that mixes the positive feedback and the negative feedback.

13. The apparatus as claimed in claim 1, the amplifier further comprising:
an inverse input;
a first pMOS transistor having a gate coupled to the input of the amplifier;
a second pMOS transistor;
a third pMOS transistor having a gate coupled to the inverse input of the amplifier and having a source coupled to a source of the first pMOS transistor and to a drain of the second pMOS transistor;
a first nMOS transistor having a gate coupled to the input of the amplifier;
a second nMOS transistor having a gate coupled to a drain of the first pMOS transistor, a drain of the first nMOS transistor, and to a gate of the second pMOS transistor; and
a third nMOS transistor having a gate coupled to the inverse input of the amplifier, a drain coupled to a drain of the third pMOS transistor and a source coupled to a source of the first nMOS transistor and to a drain of the second nMOS transistor, wherein the output of the amplifier is coupled to the drain of the third pMOS transistor and to the drain of the third nMOS transistor.

14. The apparatus as claimed in claim 13, the amplifier further comprising a resistor, wherein the gate of the second nMOS transistor and the gate of the second pMOS transistor are coupled directly together, and the drain of the first pMOS transistor and the drain of the first nMOS transistor are coupled directly together, wherein the direct coupling of the gate of the second nMOS transistor and the gate of the second pMOS transistor are coupled via the resistor to the direct coupling of the drain of the first pMOS transistor and the drain of the first nMOS transistor.

15. The apparatus according to claim 14, wherein the resistor has a resistance of approximately 5000 ohms.

16. The apparatus according to claim 13, the amplifier further comprising a control input, wherein the gate of the second nMOS transistor and the gate of the second pMOS transistor are coupled to the control input.

17. The apparatus according to claim 13, wherein a width of each of the first pMOS transistor, the second pMOS transistor and the third pMOS transistor is approximately 9.2 um, and wherein a width of the first nMOS transistor, the second nMOS transistor and the third nMOS transistor is approximately 4 um.

18. The apparatus according to claim 17, wherein a length of each of the first pMOS transistor, the second pMOS transistor, the third pMOS transistor, the first nMOS transistor, the second nMOS transistor and the third nMOS transistor is approximately 80 nm.

19. The apparatus as claimed in claim 12, the amplifier further comprising:
   an input;
   an inverse input;
   a first pMOS transistor having a gate coupled to the input of the amplifier;
   a second pMOS transistor;
   a third pMOS transistor having a gate coupled to the inverse input of the amplifier and having a source coupled to a source of the first pMOS transistor and to a drain of the second pMOS transistor;
   a first nMOS transistor having a gate coupled to the input of the amplifier;
   a second nMOS transistor having a gate coupled to a drain of the first pMOS transistor, a drain of the first nMOS transistor, and to a gate of the second pMOS transistor; and
   a third nMOS transistor having a gate coupled to the inverse input of the amplifier, a drain coupled to a drain of the third pMOS transistor and a source coupled to a source of the first nMOS transistor and to a drain of the second nMOS transistor, wherein the output of the amplifier is coupled to the drain of the third pMOS transistor and to the drain of the third nMOS transistor.

20. The apparatus as claimed in claim 19, the amplifier further comprising a resistor, wherein the gate of the second nMOS transistor and the gate of the second pMOS transistor are coupled directly together, and the drain of the first pMOS transistor and the drain of the first nMOS transistor are coupled directly together, wherein the direct coupling of the gate of the second nMOS transistor and the gate of the second pMOS transistor are coupled via the resistor to the direct coupling of the drain of the first pMOS transistor and the drain of the first nMOS transistor.

21. The apparatus according to claim 20, wherein the resistor has a resistance of approximately 5000 ohms.

22. The apparatus according to claim 19, the amplifier further comprising a control input, wherein the gate of the second nMOS transistor and the gate of the second pMOS transistor are coupled to the control input.

23. The apparatus according to claim 19, wherein a width of each of the first pMOS transistor, the second pMOS transistor and the third pMOS transistor is approximately 9.2 um, and wherein a width of the first nMOS transistor, the second nMOS transistor and the third nMOS transistor is approximately 4 um.

24. The apparatus according to claim 23, wherein a length of each of the first pMOS transistor, the second pMOS transistor, the third pMOS transistor, the first nMOS transistor, the second nMOS transistor and the third nMOS transistor is approximately 80 nm.

25. An apparatus comprising:
   an amplifier;
   a first inverter having an input coupled to an output of the amplifier; and
   a second inverter having an input coupled to an output of the first inverter and an output, wherein the output of the second inverter is fed back to an input of the amplifier;
   wherein:
   the CMOS amplifier is a hybrid Bazes and Chappell amplifier;
   the amplifier includes a first, a second and a third pMOS transistor and a first, a second and a third nMOS transistor;
   a gate of the first pMOS transistor and a gate of the first nMOS transistor are coupled to an input;
   a gate of the second pMOS transistor and a gate of the second nMOS transistor are coupled to a drain of the first pMOS transistor and a drain of the first nMOS transistor;
   a gate of the third pMOS transistor and a gate of the third nMOS transistor are coupled to an inverse input; and
   the amplifier further includes a resistor, wherein the resistor is included in a circuit that mixes positive feedback provided by the amplifier and negative feedback provided to the amplifier from the output of the second inverter.

26. The apparatus as claimed in claim 25, wherein the amplifier is a CMOS amplifier.

27. The apparatus as claimed in claim 25, wherein the gate of the second pMOS transistor and the gate of the second nMOS transistor are coupled to the drain of the first pMOS transistor and the drain of the first nMOS transistor via a resistor.

28. The apparatus as claimed in claim 25, wherein the second inverter is approximately four times the size of the first inverter.

29. The apparatus as claimed in claim 25, wherein the first inverter is approximately one-fourth the size of the output of the amplifier.

30. The apparatus as claimed in claim 25, wherein the first inverter is approximately one-fourth the size of the output of the amplifier and the first inverter is approximately one-fourth the size of the second inverter.

31. The apparatus as claimed in claim 25, wherein the output of the second inverter is fed back to the amplifier as negative feedback.

32. The apparatus as claimed in claim 25, wherein the amplifier provides positive feedback.

33. The apparatus as claimed in claim 25, wherein the amplifier provides positive feedback and the output of the second inverter is fed back to the amplifier as negative feedback.

34. The apparatus as claimed in claim 33, wherein the amplifier mixes the positive feedback and the negative feedback.

35. The apparatus as claimed in claim 25, further comprising an output, wherein the output is coupled to the output of the second inverter.

36. The apparatus as claimed in claim 25, wherein the output does not include precharge artifacts from the amplifier.

37. The apparatus as claimed in claim 25, the amplifier further comprising:
  an inverse input;
  a first pMOS transistor having a gate coupled to the input of the amplifier;
  a second pMOS transistor;
  a third pMOS transistor having a gate coupled to the inverse input of the amplifier and having a source coupled to a source of the first pMOS transistor and to a drain of the second pMOS transistor;
  a first nMOS transistor having a gate coupled to the input of the amplifier;
  a second nMOS transistor having a gate coupled to a drain of the first pMOS transistor, a drain of the first nMOS transistor, and to a gate of the second pMOS transistor; and
  a third nMOS transistor having a gate coupled to the inverse input of the amplifier, a drain coupled to a drain of the third pMOS transistor and a source coupled to a source of the first nMOS transistor and to a drain of the second nMOS transistor, wherein the output of the amplifier is coupled to the drain of the third pMOS transistor and to the drain of the third nMOS transistor.

38. The apparatus as claimed in claim 37, the amplifier further comprising a resistor, wherein the gate of the second nMOS transistor and the gate of the second pMOS transistor are coupled directly together, and the drain of the first pMOS transistor and the drain of the first nMOS transistor are coupled directly together, wherein the direct coupling of the gate of the second nMOS transistor and the gate of the second pMOS transistor are coupled via the resistor to the direct coupling of the drain of the first pMOS transistor and the drain of the first nMOS transistor.

39. The apparatus according to claim 38, wherein the resistor has a resistance of approximately 5000 ohms.

40. The apparatus according to claim 37, the amplifier further comprising a control input, wherein the gate of the second nMOS transistor and the gate of the second pMOS transistor are coupled to the control input.

41. The apparatus according to claim 37, wherein a width of each of the first pMOS transistor, the second pMOS transistor and the third pMOS transistor is approximately 9.2 um, and wherein a width of the first nMOS transistor, the second nMOS transistor and the third nMOS transistor is approximately 4 um.

42. The apparatus according to claim 41, wherein a length of each of the first pMOS transistor, the second pMOS transistor, the third pMOS transistor, the first nMOS transistor, the second nMOS transistor and the third nMOS transistor is approximately 80 nm.

* * * * *